(12) United States Patent
Ishida (10) Patent No.: US 9,647,130 B2
(45) Date of Patent: May 9, 2017

(54) DISPLAY DEVICE

(71) Applicant: Japan Display Inc., Minato-ku (JP)

(72) Inventor: Arichika Ishida, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/834,933

(22) Filed: Aug. 25, 2015

(65) Prior Publication Data

US 2016/0064568 A1 Mar. 3, 2016

(30) Foreign Application Priority Data

Aug. 27, 2014 (JP) ................. 2014-172553

(51) Int. Cl.
| | | |
|---|---|---|
| *H01L 29/10* | (2006.01) | |
| *H01L 29/786* | (2006.01) | |
| *H01L 29/24* | (2006.01) | |
| *H01L 29/49* | (2006.01) | |

(52) U.S. Cl.
CPC .......... *H01L 29/7869* (2013.01); *H01L 29/24* (2013.01); *H01L 29/4908* (2013.01); *H01L 29/4966* (2013.01); *H01L 29/4975* (2013.01); *H01L 29/78633* (2013.01)

(58) Field of Classification Search
CPC . H01L 29/24; H01L 29/4908; H01L 29/4975; H01L 29/045; H01L 29/786; H01L 29/7869; H01L 29/78693; H01L 29/78696

USPC ...................................................... 257/43, 57
See application file for complete search history.

(56) References Cited

U.S. PATENT DOCUMENTS

| | | | |
|---|---|---|---|
| 2011/0079777 A1 | 4/2011 | Akimoto | |
| 2011/0263085 A1 | 10/2011 | Yamazaki | |
| 2012/0217500 A1* | 8/2012 | Park | .......... H01L 29/45 257/59 |
| 2012/0248450 A1* | 10/2012 | Yaneda | ............ H01L 27/12 257/59 |
| 2013/0009219 A1* | 1/2013 | Yamazaki | ......... H01L 29/7869 257/288 |
| 2013/0126862 A1 | 5/2013 | Yamazaki | |
| 2013/0146870 A1 | 6/2013 | Yamazaki | |

FOREIGN PATENT DOCUMENTS

| | | |
|---|---|---|
| JP | 2011-097032 | 5/2011 |
| JP | 5296931 | 9/2013 |

* cited by examiner

*Primary Examiner* — Brook Kebede
(74) *Attorney, Agent, or Firm* — Oblon, McClelland, Maier & Neustadt, L.L.P.

(57) ABSTRACT

According to one embodiment, a display device includes a thin-film transistor. The thin-film transistor includes a gate electrode, an insulating layer disposed to superpose the gate electrode, and a semiconductor layer disposed on the insulating layer. The gate electrode is opposed to at least the semiconductor layer in part. The gate electrode includes a laminate including a first layer containing silicon as a main component and a second layer which contains titanium as a main component and which is in contact with the first layer, and is in contact with the insulating layer.

4 Claims, 3 Drawing Sheets

F I G. 1

F I G. 2

F I G. 3

F I G. 4

F I G. 5

DISPLAY DEVICE

CROSS-REFERENCE TO RELATED APPLICATIONS

This application is based upon and claims the benefit of priority from Japanese Patent Application No. 2014-172553, filed Aug. 27, 2014, the entire contents of which are incorporated herein by reference.

FIELD

Embodiments described herein relate generally to a display device.

BACKGROUND

Flat-panel display devices such as liquid crystal display devices and organic electroluminescent display devices have been utilized in various fields of office automation (OA) devices, information terminals, clocks, television receivers, etc., with features of lightness, thinness, lower power consumption, etc. More specifically, active-matrix display devices using thin-film transistors (TFTs) have been utilized as monitors for displaying large amounts of information, such as mobile devices and computers, with their fast response.

In the active-matrix display devices, thin-film transistors are utilized for pixel switching elements. The thin-film transistors are also utilized for switching elements of drivers formed in a frame region (non-display area) outside an active area (display area). Semiconductor layers of the thin-film transistors are formed of amorphous silicon, polycrystalline silicon or oxide semiconductor.

DETAILED DESCRIPTION

In general, according to one embodiment, there is provided a display device comprising a thin-film transistor, the thin-film transistor comprising a gate electrode, an insulating layer disposed to superpose the gate electrode, and a semiconductor layer disposed on the insulating layer, the gate electrode being opposed to at least the semiconductor layer in part, the gate electrode comprising a laminate including a first layer containing silicon as a main component and a second layer which contains titanium as a main component and which is in contact with the first layer, and being in contact with the insulating layer.

According to another embodiment, there is provided a display device comprising a thin-film transistor, the thin-film transistor comprising a semiconductor layer, an insulating layer disposed to superpose the semiconductor layer, and a gate electrode disposed on the insulating layer and opposed to at least the semiconductor layer in part, the gate electrode comprising a laminate including a first layer containing silicon as a main component and a second layer which contains titanium as a main component and which is in contact with the first layer, and being in contact with the insulating layer.

According to another embodiment, there is provided a display device comprising: a thin-film transistor comprising a semiconductor layer, an insulating layer disposed to superpose the semiconductor layer, and a gate electrode disposed on the insulating layer and opposed to at least the semiconductor layer in part; a light-shielding layer including a first layer containing silicon as a main component and a second layer which contains titanium as a main component and which is in contact with the first layer, and being located on a side opposite to the gate electrode with respect to the semiconductor layer and opposed to a channel region of the semiconductor layer; and another insulating layer interposed between the semiconductor layer and the light-shielding layer.

Embodiments will be described hereinafter with reference to the accompanying drawings. The disclosure is a mere example, and arbitrary change of gist which can be easily conceived by a person of ordinary skill in the art naturally falls within the inventive scope. To more clarify the explanations, the drawings may pictorially show width, thickness, shape, etc., of each portion as compared with an actual aspect, but they are mere examples and do not restrict the interpretation of the invention. In the present specification and drawings, elements like or similar to those in the already described drawings may be denoted by similar reference numbers and their detailed descriptions may be arbitrarily omitted.

First, the basic concept of the embodiments is described.

A thin-film transistor (TFT) is used as a display device. A semiconductor layer of the thin-film transistor is formed of amorphous silicon (a-Si), polycrystalline silicon (poly-Si) or oxide semiconductor. The oxide semiconductor layer has features such as a leakage current lower than an amorphous silicon layer and a polycrystalline silicon layer, mobility higher than an amorphous silicon layer, and manufacturing costs lower than a polycrystalline silicon layer.

It should be noted that a thin-film transistor utilizing an oxide semiconductor layer is often unstable with heat. This is because, if a substrate having an oxide semiconductor layer formed therein is annealed at a high temperature, properties of a thin-film transistor are varied and the display device can hardly be driven.

More specifically, an insulating layer and a passivation film forming a thin-film transistor have small hydrogen permeability. If the substrate is annealed in an environment in which hydrogen, moisture, etc., exist, hydrogen diffuses and permeates the oxide semiconductor layer. In general, if hydrogen permeates the oxide semiconductor layer, hydrogen is bonded to oxygen inside the oxide semiconductor layer and causes oxygen deficiency in the oxide semiconductor layer. The oxygen deficiency forms a donor level. For this reason, the properties of the thin-film transistor are varied, driving the display device becomes difficult, and a display device excellent in reliability is hard to obtain.

Thus, a display device excellent in reliability can be obtained by solving the above-explained problem, in the embodiments. Next, means and method for solving the above-explained problem will be explained.

Figure 1:
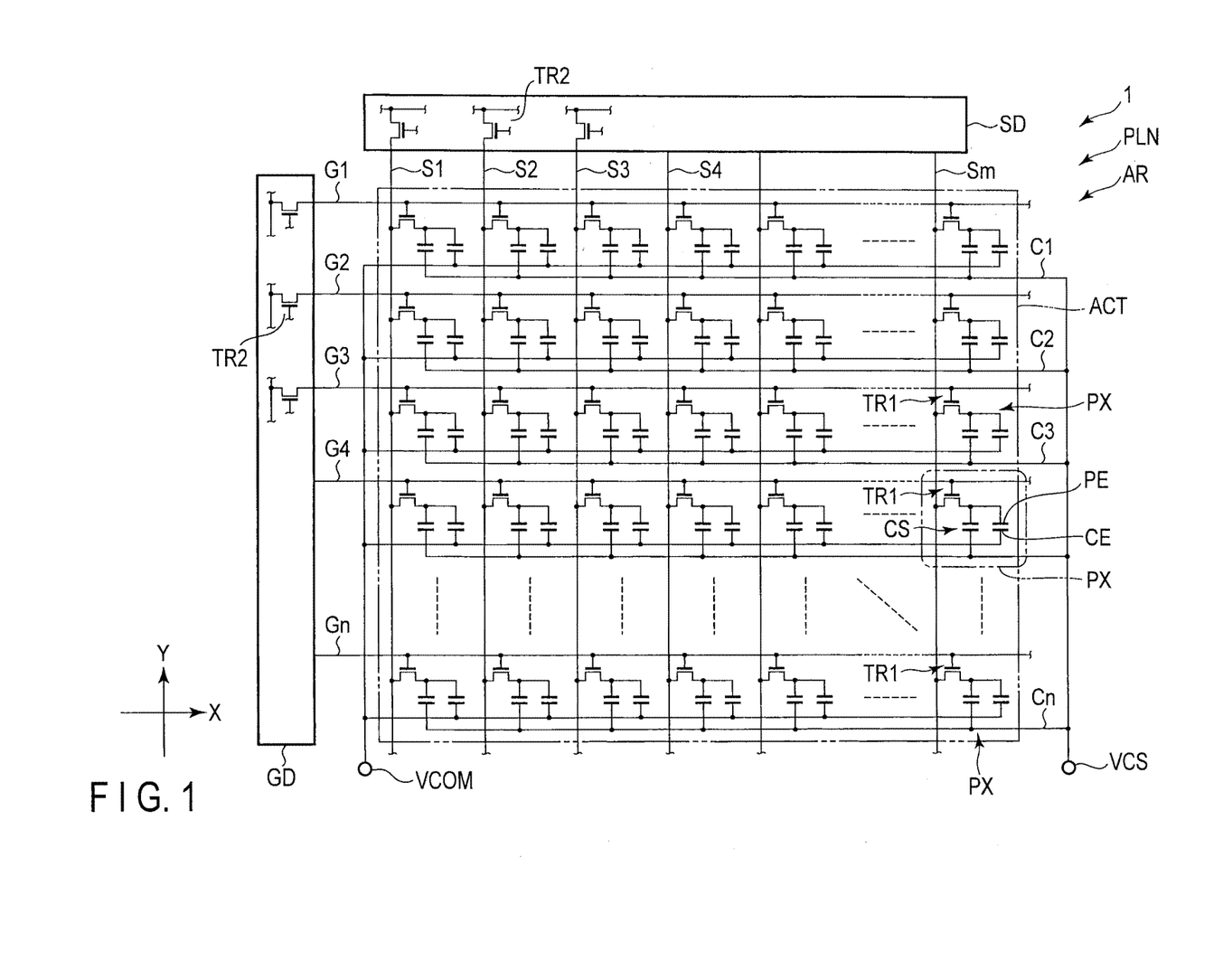
FIG. 1 is a schematic plan view showing a configuration and an equivalent circuit, of a display device of a first embodiment.

First, a display device of a first embodiment will be explained in detail. FIG. 1 is a schematic plan view showing a configuration and an equivalent circuit, of the display device of the present embodiment. A liquid crystal display device will be explained here as an example of the display device comprising a thin-film transistor.

As shown in FIG. 1, a display device 1 includes an active area (display area) ACT where an image is displayed, and a frame area (non-display area) outside the active area ACT. The display device 1 comprises a liquid crystal display panel PLN. The liquid crystal display panel PLN comprises an array substrate AR, a counter-substrate, and a liquid crystal layer. The counter-substrate is disposed opposite to the array substrate AR with a predetermined gap formed between the substrates. The liquid crystal layer is held between the array substrate AR and the counter-substrate.

In the active area ACT, the array substrate AR comprises n scanning lines G (G1 to Gn), n storage capacitance lines C (C1 to Cn), m signal lines S (S1 to Sm), and pixels PX in an m×n matrix. Each pixel PX is separated from the other pixels by two adjacent scanning lines G and two adjacent signal lines S. Alternatively, each pixel PX is separated from the other pixels by two adjacent storage capacitance lines C and two adjacent signal lines S.

The scanning lines G and the storage capacitance lines C are extended substantially parallel to a first direction X. It should be noted that the scanning lines G and the storage capacitance lines C may not be extended linearly. The scanning lines G and the storage capacitance lines C are alternately arranged in a second direction Y. The signal lines S are extended substantially parallel to the second direction Y. The signal lines S are extended substantially perpendicularly to the scanning lines G and the storage capacitance lines C. It should be noted that the signal lines S may not be extended linearly. The scanning lines G, the storage capacitance lines C and the signal lines S may be bent in part. The scanning lines G, the signal lines S and the storage capacitance lines C are formed of, for example, metals such as molybdenum, chromium, tungsten, aluminum, copper, titanium, nickel, tantalum, and silver or alloys thereof, but the materials of the lines are not particularly limited and the lines may be formed of other metals and alloys, or laminated films thereof.

Each of the scanning lines G is led to the outside of the active area ACT and is connected to a scanning line driver GD. Each of the signal lines S is led to the outside of the active area ACT and is connected to a signal line driver SD. Each of the storage capacitance lines C is led to the outside of the active area ACT and is electrically connected to a voltage application portion VCS to which an auxiliary capacitance voltage is applied.

Each pixel PX comprises a first thin-film transistor TR1, a pixel electrode PE, a common electrode CE, and a storage capacitor CS. The pixel electrode PE is electrically connected to the signal line S via the first thin-film transistor TR1. The common electrode CE is disposed on the array substrate AR or the counter-substrate. The common electrode CE is disposed to supply an electric field to the liquid crystal layer together with the pixel electrode PE. The common electrode CE is electrically connected to a power supply portion VCOM provided outside the active area ACT. The storage capacitor CS is electrically connected to the pixel electrode PE.

The first thin-film transistor TR1 is switched to a conductive state (ON) or a nonconductive state (OFF) by a control signal supplied from the scanning line driver GD via the scanning line G. A video signal output from the signal line driver SD is supplied to the corresponding pixel electrode PE via the signal line S and the first thin-film transistor TR1 in the conductive state. Due to a potential difference between the common electrode CE set at the common potential and the pixel electrode PE, a voltage applied to the liquid crystal layer is controlled.

The storage capacitor CS is configured to hold the voltage applied to the liquid crystal layer for a certain period, and is composed of a pair of electrodes opposed via an insulating film. In the storage capacitor CS, for example, one of electrodes is a part of the storage capacitance line C or an auxiliary electrode electrically connected to the storage capacitance line C, and the other electrode is an auxiliary counter-electrode connected to the pixel electrode PE.

The scanning line driver GD and the signal line driver SD are formed in a frame area. Each of the scanning line driver GD and the signal line driver SD comprises a plurality of second thin-film transistors TR2 each functioning as a switching element.

Figure 2:
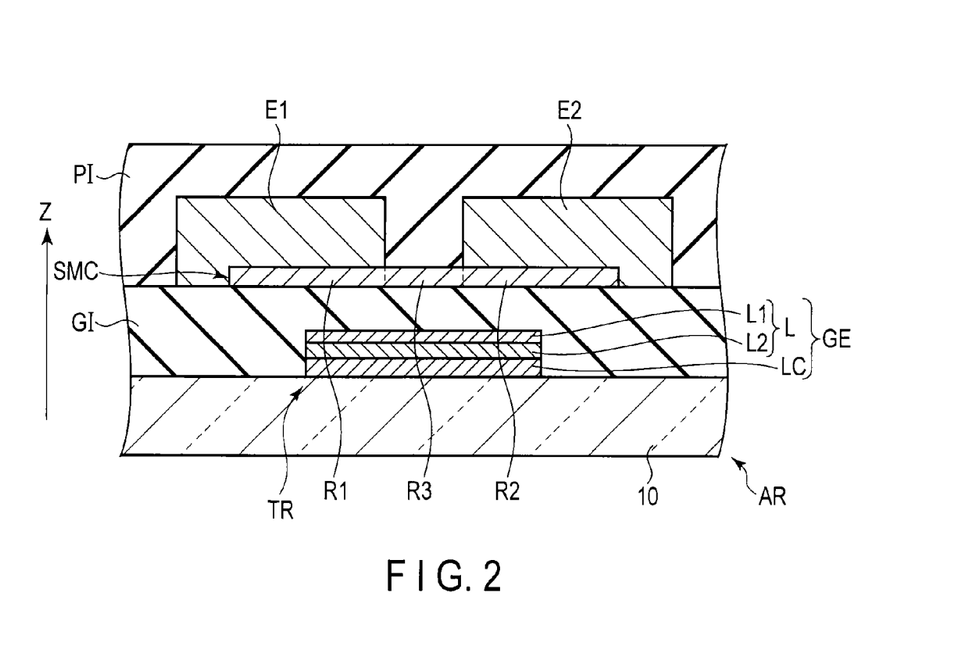
FIG. 2 is a cross-sectional view schematically showing the display device in part, illustrating a thin-film transistor.
Figure 3:
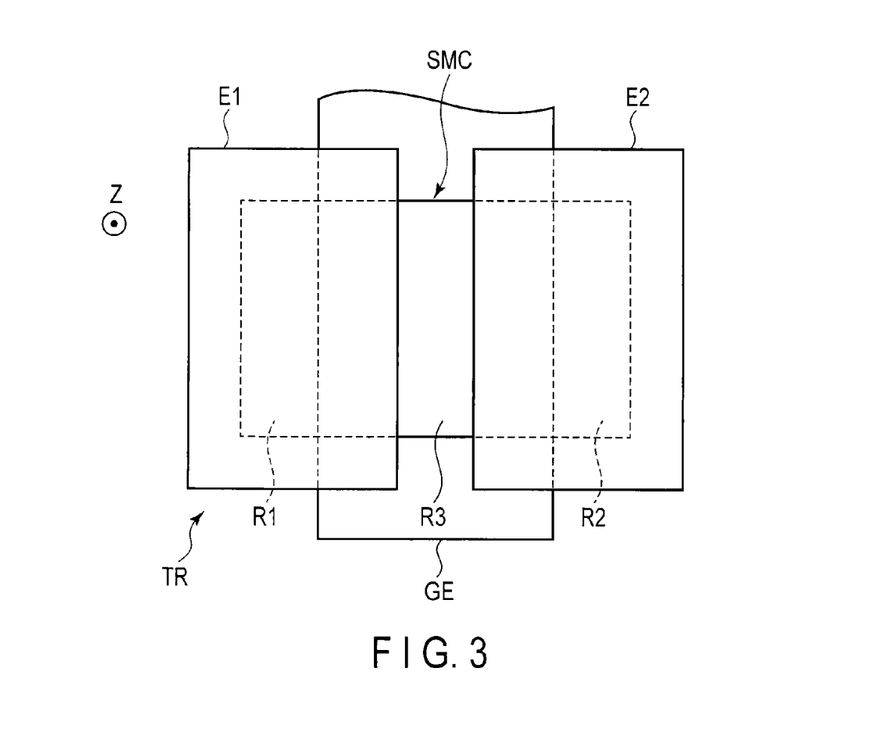
FIG. 3 is a plan view showing the thin-film transistor of FIG. 2, illustrating a gate electrode, a semiconductor layer, a first electrode and a second electrode.

FIG. 2 is a cross-sectional view schematically showing parts of the display device 1 (array substrate AR) of the embodiments, illustrating the thin-film transistor TR. In FIG. 2, main portions alone necessary for explanations, of the array substrate AR, are shown. FIG. 3 is a plan view showing the thin-film transistor TR of FIG. 2, illustrating a gate electrode GE, a semiconductor layer SMC, a first electrode E1 and a second electrode E2.

At least one of the first thin-film transistor TR1 and the second thin-film transistor TR2 shown in FIG. 1 is composed of a thin-film transistor TR shown in FIG. 2 and FIG. 3. In the present embodiment, each of the above-explained first thin-film transistor TR1 and second thin-film transistor TR2 is composed of a thin-film transistor TR.

As shown in FIG. 2 and FIG. 3, the thin-film transistor TR is formed above the main surface of the insulating substrate 10 of the array substrate AR and functions as a switching element. The thin-film transistor TR comprises a semiconductor layer SMC, a gate electrode GE, a gate insulating layer GI serving as an insulating layer, a first electrode E1 and a second electrode E2. Roughly speaking, the gate electrode GE is spaced apart from the semiconductor layer SMC to be opposed to at least a part of the semiconductor layer SMC, and the gate insulating layer GI is interposed between the semiconductor layer SMC and the gate electrode GE and is in contact with the semiconductor layer SMC.

An insulating substrate 10 is formed of a material such as glass or resin having a light transmitting property and an insulation property. A base insulating film may be formed on the insulating substrate 10 for planarization of the main surface of the insulating substrate 10, prevention of impurity diffusion from the insulating substrate, etc. The main surface of the insulating substrate 10 is a surface parallel to an X-Y plane defined by the first direction X and the second direction Y. A third direction Z is a normal direction of the main surface of the insulating substrate, and is perpendicular to each of the first direction X and the second direction Y.

The gate electrode GE is formed above the main surface of the insulating substrate 10. For this reason, the gate electrode GE may be in contact with the main surface of the insulating substrate 10 or may be positioned remote from the main surface. In the latter case, the base insulating film is interposed between the main surface and the gate electrode GE.

The gate electrode GE includes a laminate L including at least a first layer L1 formed of a material containing silicon as a main component and a second layer L2 which is formed of a material containing titanium as a main component and which is in contact with the first layer L1. Forming the layer of the material containing silicon as a main component indicates that the layer has an atomic number ratio of 90% or more. In addition, forming the layer of the material containing titanium as a main component indicates that the layer has an atomic number ratio of 50% or more.

In the present embodiment, the gate electrode GE further includes a core layer LC. The core layer LC is located on a side opposed to the first layer L1 with respect to the second layer L2. The core layer LC is a core layer of the gate electrode GE and is also a core having an electronic function of the gate electrode GE. The core layer LC is formed of a metal such as molybdenum (Mo), tungsten (W), chromium (Cr), copper (Cu), aluminum (Al), titanium (Ti), or tantalum (Ta), or an alloy containing the metals. In the present embodiment, the core layer LC is formed of an aluminum alloy.

The gate electrode GE may include the core layer LC as needed. For example, if the gate electrode GE is formed without the core layer LC, the second layer L2 is formed to serve as the core layer of the gate electrode GE.

The first layer L1 and the second layer L2 form a silicide region (titanium silicide region) silicified in vicinity of at least a boundary between the layers. The silicide region is formed in a thermal treatment step of the manufacturing process of the gate electrode GE. In other words, the silicide region is formed by heating the stacked second layer L2 and the first layer L1, and mutually diffusing and alloying the layers. If the thickness of the first layer L1 and the thickness of the second layer L2 are small, the first layer L1, the second layer L2 or the whole region of both layers may form the silicide region.

The core layer LC, the second layer L2 and the first layer L1 are stacked in order above the main surface of the insulating substrate 10. The first layer L1 is located more closely to the semiconductor layer SMC than to the second layer L2. The size of each of the first layer L1 and the second layer L2 is the same as the size of the core layer LC, and the first layer L1 and the second layer L2 are formed to completely superpose the core layer LC. In this case, the core layer LC, the second layer L2 and the first layer L1 can be simultaneously formed by patterning the stacked aluminum alloy film, titanium film and silicon film in a single photolithographic step. Since two or three photolithographic steps are unnecessary, reduction in manufacturing steps can be attempted.

The gate electrode GE may be integrally formed of the same material in the same-level layer as the scanning line G. In this case, the scanning line G has a three-layer stacked structure. The scanning line G may be integrally formed of the same material in the same-level layer as the core layer LC. In this case, the scanning line G has a single-layer structure and is integrally formed of the same material in the same-level layer as the core layer LC.

In other words, the laminate of the silicon layer (first layer L1) and the titanium layer (second layer L2) may form at least the gate electrode GE and may form the scanning line G as needed.

The gate insulating layer GI is disposed to superpose the gate electrode GE. For this reason, the laminate L is in contact with the gate insulating layer GI. In the present embodiment, the gate insulating layer GI is formed not only on the gate electrode GE, but also above the main surface of the insulating substrate 10 displaced from the gate electrode GE.

The gate insulating layer GI should desirably be formed of an inorganic material which, even in a form of thin film, is virtually free of drawbacks such as producing a short circuit. The gate insulating layer GI includes, for example, a silicon oxide layer containing silicon oxide (SiOX) as a main component. In the present embodiment, an entire body of the gate insulating layer GI is formed of a silicon oxide layer. The silicon oxide layer is formed by, for example, plasma chemical vapor deposition (CVD).

The inorganic material is silicon oxide, silicon nitride, or the like, but is not particularly limited and may be an oxide of aluminum, hafnium, yttrium, etc. The gate insulating layer GI may be a laminate. For example, the gate insulating layer GI can be composed of a laminated film including a silicon oxide layer containing silicon oxide as a main component and the other insulating layer, for example, a silicon nitride (SiNX) layer. If the gate insulating layer GI is formed of a laminated film, the gate insulating layer GI should desirably be formed such that the silicon oxide layer is in contact with the semiconductor layer SMC.

The semiconductor layer SMC is disposed on the gate insulating layer GI. The semiconductor layer SMC includes a first region R1, a second region R2, and a channel region R3. The channel region R3 is located between the first region R1 and the second region R2 in a direction extended along the main surface of the insulating substrate 10. The gate electrode GE is opposed to at least the channel region R3 of the semiconductor layer SMC, in a third direction Z. In the present embodiment, the gate electrode GE is opposed to an entire body of the channel region R3, a part of the first region R1, and a part of the second region R2.

Either of the first region R1 and the second region R2 functions as a source region while the other of the first region R1 and the second region R2 functions as a drain region. The first region R1 and the second region R2 may have the same resistance as or a lower resistance than the channel region R3.

In the present embodiment, the semiconductor layer SMC is an oxide semiconductor layer formed of an oxide semiconductor. An oxide containing at least one of indium, gallium and zinc can be preferably used as the oxide semiconductor. Typical examples of the oxide semiconductor are indium-gallium-zinc oxide (IGZO), indium gallium oxide (IGO), indium zinc oxide (IZO), zinc tin oxide (ZnSnO), zinc oxide (ZnO), transparent amorphous oxide semiconductor (TAOS), etc.

High mobility can be accomplished by the semiconductor layer SMC formed of the oxide semiconductor as compared with the semiconductor layer formed of amorphous silicon. In addition, a film can be formed uniformly over a large area at a low temperature and reduction in the manufacturing costs can be attempted by the semiconductor layer SMC formed of the oxide semiconductor as compared with the semiconductor layer formed of polycrystalline silicon.

The first electrode E1 is located above the semiconductor layer SMC and is in contact with the first region R1. In the present embodiment, the first electrode E1 is formed on the gate insulating layer GI and the semiconductor layer SMC. One of ends of the first electrode E1 is opposed to a boundary between the first region R1 and the channel region R3.

The second electrode E2 is located above the semiconductor layer SMC and is in contact with the second region R2. In the present embodiment, the second electrode E2 is formed on the gate insulating layer GI and the semiconductor layer SMC. One of ends of the second electrode E2 is opposed to a boundary between the second region R2 and the channel region R3. In other words, in the present embodiment, the channel length of the channel region R3 corresponds to a distance from the opposed end of the first electrode E1 to the opposed end of the second electrode E2.

Either of the first electrode E1 and the second electrode E2 functions as a source electrode while the other of the electrodes functions as a drain electrode. For example, when the first electrode E1 functions as a source electrode, the first region R1 electrically connected to the first electrode E1 functions as a source region. At this time, the second electrode E2 functions as a drain electrode and the second region R2 electrically connected to the second electrode E2 functions as a drain region.

Each of the first electrode E1 and the second electrode E2 is formed of, for example, a metal such as molybdenum, tungsten, aluminum, titanium, or copper, or an alloy or a laminated film thereof. In the present embodiment, each of the first electrode E1 and the second electrode E2 is composed of a metal layered film, and has a multi-layered structure (Ti-based/Al-based) of a lower layer (core layer) formed of a metallic material containing Al as a main component, such as Al, AlSi, AlNd or AlCu, and an upper layer (top barrier metal layer) formed of a metallic material containing Ti as a main component, such as Ti or TiN. The lower layer is formed to be sufficiently thicker than the upper layer (top barrier metal layer). The lower layer side of each of the first electrode E1 and the second electrode E2 is in contact with the semiconductor layer SMC.

As explained above, the thin-film transistor TR of the present embodiment has a structure of a bottom-gate thin-film transistor.

After the first electrode E1 and the second electrode E2 are formed and then the thin-film transistor TR is formed as explained above, a passivation film PI serving as an insulating film is formed above the main surface of the insulating substrate 10. The passivation film PI covers the gate insulating layer GI, the semiconductor layer SMC, the first electrode E1 and the second electrode E2.

In the present embodiment, the passivation film PI is composed of a laminated film including a silicon oxide layer containing silicon oxide as a main component and the other insulating layer, for example, a silicon nitride layer. The passivation film PI is formed by plasma chemical vapor deposition (CVD). The passivation film PI can be composed of various laminated films, but can also be formed of an insulating layer. Silicon oxide, silicon nitride or an oxide such as that of aluminum, hafnium, or yttrium can be used for formation of the passivation film PI.

The display device 1 of the first embodiment constituted as explained above comprises the thin-film transistor TR comprising the semiconductor layer SMC, the gate electrode GE, and the gate insulating layer GI. The gate electrode GE is spaced apart from the semiconductor layer SMC and is opposed to at least a part of the semiconductor layer SMC. The gate insulating layer GI is interposed between the semiconductor layer SMC and the gate electrode GE and is in contact with the semiconductor layer SMC. The gate electrode GE comprises the laminate L. The laminate L includes the first layer L1 formed of a material containing silicon as a main component and the second layer L2 which is formed of a material containing titanium as a main component and which is in contact with the first layer L1, and is in contact with the gate insulating layer GI.

A large amount of hydrogen can be stored in vicinity of an interface between the first layer L1 and the second layer L2. This is because if titanium and silicon form silicide, the silicide has a property of occluding a large amount of hydrogen.

A laminated film including a polycrystalline silicon layer formed of polycrystalline silicon and a titanium layer formed of titanium is formed on the silicon oxide film, and the amount of hydrogen stored in vicinity of an interface between the polycrystalline silicon layer and the titanium layer when the laminated film is annealed at 350° C. is set as a first hydrogen storage amount. In addition, a laminated film including a polycrystalline silicon layer formed of polycrystalline silicon and a molybdenum layer formed of molybdenum is formed on the silicon oxide film, and the amount of hydrogen stored in vicinity of an interface between the polycrystalline silicon layer and the molybdenum layer when the laminated film is annealed at 350° C. is set as a second hydrogen storage amount. The polycrystalline silicon layer of each sample has a thickness of approximately 50 nm, and the titanium layer and the molybdenum layer have the same thickness.

The present inventor checked the first hydrogen storage amount and the second hydrogen storage amount, obtaining a result that the first hydrogen storage amount is larger than the second hydrogen storage amount. More specifically, the first hydrogen storage amount is approximately ten times as large as the second hydrogen storage amount.

Thus, if the laminate L including the first layer L1 and the second layer L2 is formed, the amount of hydrogen reaching the semiconductor layer SMC can be reduced even if hydrogen enters from the outside after annealing at a high temperature and then hydrogen permeates the passivation film PI and the gate insulating film GI. In other words, since the thin-film transistor TR comprises the laminate L, variation in the property of the thin-film transistor TR can be reduced and improvement of thermal stability of the thin-film transistor TR can be attempted.

As explained above, the passivation film PI and the gate insulating layer GI have a characteristic of permeating a small amount of hydrogen. For this reason, if the thin-film transistor TR is formed without the laminate L and annealing is executed in an environment in which hydrogen, moisture, etc., are present, hydrogen is diffused and a large amount of hydrogen enters the semiconductor layer SMC. In general, if hydrogen enters the semiconductor layer SMC, hydrogen is bonded to oxygen in the semiconductor layer SMC and causes oxygen deficiency in the semiconductor layer SMC. Since the oxygen deficiency forms a donor level, the property of the thin-film transistor TR is greatly varied as a result.

Based on the above, the display device 1 excellent in reliability can be obtained according to the first embodiment.

Next, a display device of a second embodiment will be explained in detail. The display device 1 of the present embodiment is formed in the same manner as the display device of the first embodiment except the feature that a thin-film transistor TR does not have a structure of a bottom-gate thin-film transistor, but a structure of a top-gate thin-film transistor.

Figure 4:
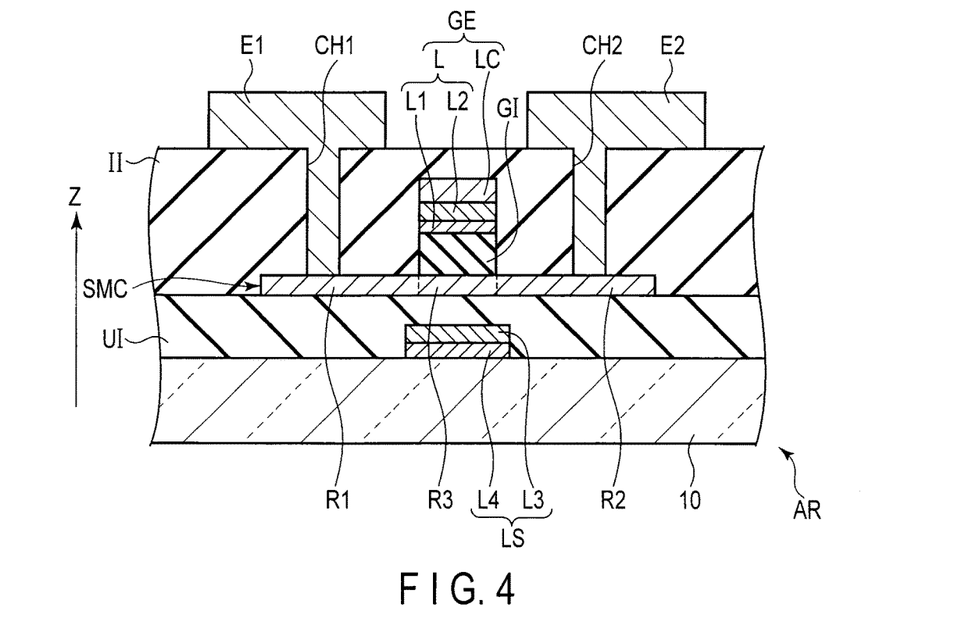
FIG. 4 is a cross-sectional view schematically showing a display device of a second embodiment in part, illustrating a thin-film transistor.
Figure 5:
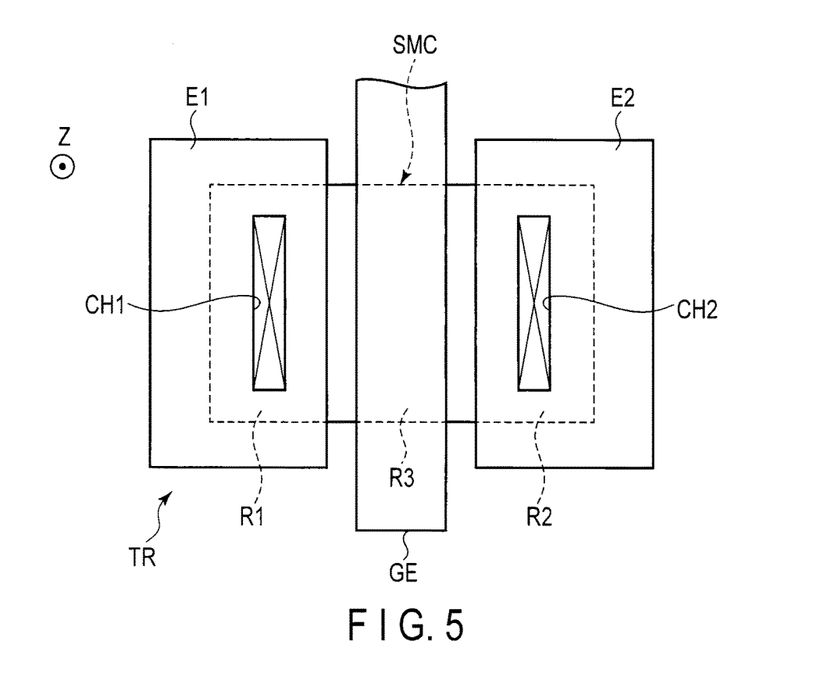
FIG. 5 is a plan view showing a thin-film transistor of FIG. 4, illustrating a gate electrode, a semiconductor layer, a first electrode and a second electrode.

FIG. 4 is a cross-sectional view schematically showing the display device 1 (array substrate AR) of the present embodiment in part, illustrating the thin-film transistor TR. In FIG. 4, only main portions necessary for explanations, of the array substrate AR, are illustrated. FIG. 5 is a plan view showing the thin-film transistor TR of FIG. 4, illustrating a gate electrode GE, a semiconductor layer SMC, a first electrode E1 and a second electrode E2.

As shown in FIG. 4 and FIG. 5, the thin-film transistor TR is formed above a main surface of an insulating substrate 10 of the array substrate AR, and comprises the semiconductor layer SMC, the gate electrode GE, a gate insulating layer GI serving as an insulating layer, the first electrode E1 and the second electrode E2.

A light-shielding layer LS is formed above the main surface of an insulating substrate 10. For this reason, the light-shielding layer LS may be in contact with the main surface of the insulating substrate 10 or may be located remote from the main surface. In the latter case, the base insulating film explained above is interposed between the main surface and the light-shielding layer LS.

The light-shielding layer LS is located on a side opposite to the gate electrode GE with respect to the semiconductor layer SMC and is opposed to a channel region R3 of the semiconductor layer SMC. For this reason, the light-shielding layer LS can block light emitted from an outer surface side opposite to the main surface of the insulating substrate 10 toward the channel region R3.

The light-shielding layer LS includes a third layer L3 containing silicon as a main component and a fourth layer L4 which contains titanium as a main component and which is in contact with the third layer L3. The third layer L3 and the fourth layer L4 form a silicide region (titanium silicide region) silicified in vicinity of at least a boundary between the layers. The silicide region is formed in a thermal treatment step of the process of manufacturing the light-shielding layer LS. In other words, the silicide region is formed by heating the stacked fourth layer L4 and the third layer L3, and mutually diffusing and alloying the layers. If the thickness of the third layer L3 and the thickness of the fourth layer L4 are small, the third layer L3, the fourth layer L4 or the whole region of both layers may form the silicide region.

The fourth layer L4 and the third layer L3 are stacked in order, above the main surface of the insulating substrate 10. The third layer L3 is located more closely to the semiconductor layer SMC than to the fourth layer L4. The size of the third layer L3 is the same as the size of the fourth layer L4, and the third layer L3 is formed to completely superpose the fourth layer L4. In this case, the fourth layer L4 and the third layer L3 can be simultaneously formed by patterning the stacked titanium film and silicon film in a photolithographic step. Since two photolithographic steps are unnecessary, reduction in manufacturing steps can be attempted.

An undercoat insulating layer UI serving as an insulating layer is interposed between the semiconductor layer SMC and the light-shielding layer LS. The undercoat insulating layer UI is formed on the insulating substrate 10 and the light-shielding layer LS to cover the light-shielding layer LS.

In the present embodiment, the undercoat insulating layer UI is composed of a laminated film including a silicon oxide layer containing silicon oxide as a main component and the other insulating layer, for example, a silicon nitride layer. The undercoat insulating layer UI is formed by plasma CVD. The undercoat insulating layer UI can be composed of various laminated films, but can also be formed of an insulating layer. Silicon oxide, silicon nitride or an oxide such as that of aluminum, hafnium, or yttrium can be used for formation of the undercoat insulating layer UI.

The semiconductor layer SMC is disposed on the undercoat insulating layer UI. The semiconductor layer SMC includes a first region R1, a second region R2, and a channel region R3. In the present embodiment, the resistance of each of the first region R1 and the second region R2 is lower than the resistance of the channel region R3. The reductive element concentration of each of the first region R1 and the second region R2 is higher than the reductive element concentration of the channel region R3. The resistances of the first region R1, the second region R2 and the channel region R3 are not limited to the above-explained examples, but each of the first region R1 and the second region R2 may have the same resistance as the channel region R3.

In the present embodiment, the semiconductor layer SMC is an oxide semiconductor layer formed of an oxide semiconductor.

The light-shielding layer LS is opposed to at least the channel region R3 of the semiconductor layer SMC, in a third direction Z. In the present embodiment, the gate electrode GE is opposed to an entire body of the channel region R3, a part of the first region R1, and a part of the second region R2. However, as the region where the light-shielding layer LS and the first region R1 are opposed to each other and the region where the light-shielding layer LS and the second region R2 are opposed to each other are larger, the parasitic capacitance becomes greater and a bad influence given to the operations of the thin-film transistor TR becomes greater, and the size of the light-shielding layer LS needs to be considered.

The gate insulating layer GI is disposed to superpose the semiconductor layer SMC. The gate insulating layer GI is formed on at least the channel region R3. In the present embodiment, the gate insulating layer GI is formed on the channel region R3 alone.

The gate insulating layer GI should desirably be formed of an inorganic material which, even in the form of thin film, is virtually free of drawbacks such as producing a short circuit. The gate insulating layer GI includes, for example, a silicon oxide layer containing silicon oxide as a main component. In the present embodiment, an entire body of the gate insulating layer GI is formed of a silicon oxide layer. The silicon oxide layer is formed by, for example, plasma CVD.

The inorganic material is silicon oxide, silicon nitride, or the like, but is not particularly limited and may be an oxide such as that of aluminum, hafnium, or yttrium. The gate insulating layer GI may be a laminated film.

The gate electrode GE is disposed on the gate insulating layer GI and is opposed to at least a part of the semiconductor layer SMC. In the present embodiment, the gate electrode GE is disposed on the gate insulating layer GI alone. In addition, the gate electrode GE is opposed to the only channel region R3 of the semiconductor layer SMC, in a third direction Z.

The gate electrode GE includes a laminate L including at least a first layer L1 formed of a material containing silicon as a main component and a second layer L2 which is formed of a material containing titanium as a main component and which is in contact with the first layer L1.

In the present embodiment, the gate electrode GE further includes a core layer LC. The core layer LC is located on a side opposed to the first layer L1 with respect to the second layer L2. In the present embodiment, the core layer LC is formed of an aluminum alloy.

The gate electrode GE may include the core layer LC as needed. For example, if the gate electrode GE is formed without the core layer LC, the second layer L2 is formed to serve as the core layer of the gate electrode GE.

The first layer L1 and the second layer L2 form a silicide region (titanium silicide region) silicified in vicinity of at least a boundary between the layers. In the present embodiment, too, if the thickness of the first layer L1 and the thickness of the second layer L2 are small, the first layer L1, the second layer L2 or the whole region of both layers may form the silicide region.

The first layer L1, the second layer L2 and the core layer LC are stacked in order, above the main surface of the insulating substrate 10. The first layer L1 is located more closely to the semiconductor layer SMC than to the second layer L2. The first layer L1 (laminate L) is in contact with the gate insulating layer GI. The size of each of the first layer L1, the second layer L2 and the core layer LC is the same as the size of the gate insulating layer GI, and the first layer L1, the second layer L2 and the core layer LC are formed to completely superpose the gate insulating layer GI. In this case, the gate insulating layer GI, the first layer L1, the second layer L2, and the core layer LC can be simultaneously formed by patterning the stacked silicon oxide film, silicon film, titanium film, and aluminum alloy film in a single photolithographic step. Since two, three or four photolithographic steps are unnecessary, reduction in manufacturing steps can be attempted.

In the present embodiment, too, the gate electrode GE may be integrally formed of the same material in the same-level layer as the scanning line G. The scanning line G may be integrally formed of the same material in the same-level layer as the core layer LC. In other words, the laminate of the silicon layer (first layer L1) and the titanium layer (second layer L2) may form at least the gate electrode GE and may form the scanning line G as needed.

An interlayer insulating film II is formed on the undercoat insulating film UI, the semiconductor layer SMC, and the gate electrode GE. The interlayer insulating film II covers side surfaces of the gate insulating layer GI and side surfaces of the gate electrode GE.

In the present embodiment, the interlayer insulating film II is composed of a laminated film including a silicon oxide layer containing silicon oxide as a main component and the other insulating layer, for example, a silicon nitride layer. The interlayer insulating film II is formed by plasma CVD. The interlayer insulating film II can be composed of various laminated films, but can also be formed of an insulating layer. Silicon oxide, silicon nitride or an oxide such as that of aluminum, hafnium, or yttrium can be used for formation of the interlayer insulating film II.

A first contact hole CH1 is formed in a region opposed to the first region R1, in the interlayer insulating film II. In addition, a second contact hole CH2 is formed in a region opposed to the second region R2, in the interlayer insulating film II. The first contact hole CH1 and the second contact hole CH2 are extended in the third direction Z, and penetrate the interlayer insulating film II. The first contact hole CH1 exposes a part of the first region R1 to an outer side of the interlayer insulating film II, and the second contact hole CH2 exposes a part of the second region R2 to an outer side of the interlayer insulating film II.

A first electrode E1 and a second electrode E2 are formed on the interlayer insulating film II. The first electrode E1 is in contact with the first region R1 through the first contact hole CH1. The second electrode E2 is in contact with the second region R2 through the second contact hole CH2. Either of the first electrode E1 and the second electrode E2 functions as a source electrode while the other of the electrodes functions as a drain electrode.

Each of the first electrode E1 and the second electrode E2 is formed of, for example, a metal such as molybdenum, tungsten, aluminum, titanium, or copper, or an alloy or a laminated film thereof. In the present embodiment, each of the first electrode E1 and the second electrode E2 is composed of a metal layered film, and has a multi-layered structure (Ti-based/Al-based) of a lower layer (core layer) formed of a metallic material containing Al as a main component, such as Al, AlSi, AlNd or AlCu, and an upper layer (top barrier metal layer) formed of a metallic material containing Ti as a main component, such as Ti or TiN. The lower layer side of each of the first electrode E1 and the second electrode E2 is in contact with the semiconductor layer SMC.

As explained above, the thin-film transistor TR of the present embodiment has a structure of a top-gate thin-film transistor.

The display device 1 of the second embodiment constituted as explained above comprises the thin-film transistor TR comprising the semiconductor layer SMC, the gate electrode GE, and the gate insulating layer GI. The gate electrode GE comprises the laminate L. The laminate L includes the first layer L1 and the second layer L2, and is in contact with the gate insulating layer GI. For this reason, in the present embodiment, too, the same advantages as the above-explained embodiment can be obtained.

The display device 1 often comprises a backlight unit. The backlight unit is opposed to an outer surface opposite to the main surface of the insulating substrate 10. In this case, if the semiconductor layer SMC is irradiated with light from the backlight unit, a leakage current becomes great. Thus, the display device 1 comprises the light-shielding layer LS, in the present embodiment. For this reason, if the display device 1 uses the backlight unit, the leakage current of the semiconductor layer SMC can be reduced by disposing the light-shielding layer LS at the display device 1.

Furthermore, not only the gate electrode GE, but also the light-shielding layer LS comprises a laminate of a silicon layer (third layer L3) and a titanium layer (fourth layer L4), in the present embodiment. The light-shielding layer LS forms a silicide region (titanium silicide region). Not only the gate insulating layer GI, but also the interlayer insulating film II and the undercoat insulating layer UI have a characteristic of permeating a small amount of hydrogen. In the present embodiment, however, a large amount of hydrogen can be stored in vicinity of an interface between the third layer L3 and the fourth layer L4. The amount of hydrogen reaching the semiconductor layer SMC can be therefore further reduced.

Based on the above, the display device 1 excellent in reliability can be obtained according to the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the second layer L2 may be located more closely to the semiconductor layer SMC than to the first layer L1. In these cases, too, the same advantages as those of the above-explained embodiments can be obtained. In addition, the fourth layer L4 may be located more closely to the semiconductor layer SMC than to the third layer L3. In these cases, too, the same advantages as those of the above-explained embodiments can be obtained.

In the above-explained second embodiment, at least one of the gate electrode GE and the light-shielding layer LS may comprise the laminate of the silicon layer (first layer L1 or third layer L3) and the titanium layer (second layer L2 or fourth layer L4). In this case, too, since at least either of the gate electrode GE and the light-shielding layer LS can store a large amount of hydrogen, the amount of hydrogen reaching the semiconductor layer SMC can be further reduced. For example, if the semiconductor layer SMC is not irradiated with light, the display device 1 may be formed without the light-shielding layer LS.

In the above-explained embodiments, the liquid crystal display device is described as an example of the display device. The embodiments can be applied to a transmissive type liquid crystal display device and a reflective type liquid crystal display device. The embodiments can be applied to any flat panel or flexible display devices, such as organic electroluminescent display devices, other natural-light display devices, electronic paper display devices comprising cataphoretic elements, etc. It is needless to say that the embodiments can be applied to middle or small display devices and large display devices without particular limitation.

The above-explained thin-film transistor TR can be applied to semiconductor devices other than display devices, for example, various memories or various sensors.

What is claimed is:
1. A display device comprising a thin-film transistor,
the thin-film transistor comprising a gate electrode, an insulating layer disposed to superpose the gate electrode, and a semiconductor layer disposed on the insulating layer,
the gate electrode being opposed to at least the semiconductor layer in part, the gate electrode comprising a laminate including a first layer containing silicon as a main component and a second layer which contains titanium as a main component and which is in contact with the first layer, and being in contact with the insulating layer,
the first layer and the second layer forming a silicide region silicified in vicinity of at least a boundary between the first layer and the second layer,
the silicide region storing hydrogen.
2. The display device of claim 1, wherein the semiconductor layer is an oxide semiconductor layer containing at least one of indium, gallium and zinc.
3. The display device of claim 1, wherein the first layer is located more closely to the semiconductor layer than to the second layer.
4. The display device of claim 1, wherein the second layer is located more closely to the semiconductor layer than to the first layer.

* * * * *